(12) United States Patent
Ishida et al.

(10) Patent No.: US 8,704,185 B2
(45) Date of Patent: Apr. 22, 2014

(54) RADIATION DETECTION APPARATUS, MANUFACTURING METHOD THEREFOR, AND RADIATION IMAGING SYSTEM

(75) Inventors: Yohei Ishida, Honjo (JP); Satoshi Okada, Tokyo (JP); Kazumi Nagano, Fujisawa (JP); Keiichi Nomura, Honjo (JP); Yoshito Sasaki, Honjo (JP)

(73) Assignee: Canon Kabushiki Kaisha, Tokyo (JP)

( * ) Notice: Subject to any disclaimer, the term of this patent is extended or adjusted under 35 U.S.C. 154(b) by 240 days.

(21) Appl. No.: 13/108,317

(22) Filed: May 16, 2011

(65) Prior Publication Data

US 2011/0309258 A1 Dec. 22, 2011

(30) Foreign Application Priority Data

Jun. 17, 2010 (JP) .................. 2010-138644

(51) Int. Cl.
  *G01T 1/20* (2006.01)
(52) U.S. Cl.
  USPC ........................ 250/369; 250/361 R
(58) Field of Classification Search
  USPC .............................. 250/369, 361 R
  See application file for complete search history.

(56) References Cited

U.S. PATENT DOCUMENTS

| 6,354,595 | B1 | 3/2002 | Vieux et al. | 277/312 |
|---|---|---|---|---|
| 7,205,568 | B2 | 4/2007 | Watanabe et al. | 257/59 |
| 7,256,404 | B2 | 8/2007 | Inoue et al. | 250/370.11 |
| 7,391,029 | B2 | 6/2008 | Takeda et al. | 250/370.11 |
| 7,435,968 | B2 | 10/2008 | Watanabe et al. | 250/370.14 |
| 7,514,686 | B2 | 4/2009 | Ogawa et al. | 250/361 R |
| 7,535,506 | B2 | 5/2009 | Nomura et al. | 348/308 |
| 7,541,617 | B2 | 6/2009 | Mochizuki et al. | 257/72 |
| 7,595,493 | B2 | 9/2009 | Okada et al. | 250/370.11 |
| 2006/0033032 | A1* | 2/2006 | Inoue et al. | 250/370.11 |
| 2007/0090299 | A1* | 4/2007 | Kozakai et al. | 250/370.01 |
| 2009/0283685 | A1 | 11/2009 | Takeda et al. | 250/370.11 |
| 2010/0102236 | A1 | 4/2010 | Inoue et al. | 250/361 R |

FOREIGN PATENT DOCUMENTS

| JP | 2006-052986 | 2/2006 |
|---|---|---|
| JP | 2006-078471 | 3/2006 |

OTHER PUBLICATIONS

Thomas P. Flanagan, "Re-Evaluating Hot Melt Adhesives", *Adhesives Age*, vol. 9, No. 3, pp. 28-31 (Mar. 1966).

* cited by examiner

*Primary Examiner* — David Porta
*Assistant Examiner* — Kenneth J Malkowski
(74) *Attorney, Agent, or Firm* — Fitzpatrick, Cella, Harper & Scinto (57) ABSTRACT

A radiation detection apparatus comprising: a sensor panel including a photoelectric conversion region and an electrically conductive pattern that is electrically connected to the photoelectric conversion region; a scintillator layer disposed over the photoelectric conversion region of the sensor panel; a wiring member including a portion overlapping with the electrically conductive pattern and electrically connected to the electrically conductive pattern and; and a protective film covering the scintillator layer and the portion of the wiring member that overlaps with the electrically conductive pattern is provided. A region of the protective film that covers the wiring member includes a portion that is press-bonded to the sensor panel.

13 Claims, 8 Drawing Sheets

RADIATION DETECTION APPARATUS, MANUFACTURING METHOD THEREFOR, AND RADIATION IMAGING SYSTEM

BACKGROUND OF THE INVENTION

1. Field of the Invention

The present invention relates to a radiation detection apparatus, a manufacturing method therefor, and a radiation imaging system.

2. Description of the Related Art

In recent years, digital radiation detection apparatuses have become commercially available where multiple photoelectric conversion elements are formed on the surface of a sensor panel, and the sensor panel has a scintillator (for example, a phosphor) laminated on that converts radiation such as X-rays into light having a wavelength detectable by the photoelectric conversion elements. Standard examples of the scintillator material include Tb-doped GdOS and alkali halides typified by Tl-doped CsI. Because alkali halide scintillators in particular are highly deliquescent, various devises have been introduced in order to improve humidity resistance (or moisture proofing) of a radiation detection apparatus. For improved humidity resistance of a radiation detection apparatus, Japanese Patent Laid-Open No. 2006-78471 proposes a technique in which a scintillator and a sensor panel around the scintillator are covered with a protective layer containing a hot-melt resin, and a portion of the protective layer that covers the sensor panel around the scintillator is hot-pressed. Japanese Patent Laid-Open No. 2006-52986 proposes a technique in which the portion of a hot-melt resin that covers a frame member provided around a scintillator is hot-pressed. These techniques suppress entry of moisture from gaps between the protective layer and the sensor panel and thereby improve the humidity resistance of the radiation detection apparatuses.

SUMMARY OF THE INVENTION

According to both of the aforementioned documents, outside the region in which the protective layer has been hot-pressed is located a region for connecting a wiring member to the sensor panel. As a result, a region from the edge of the scintillator to the edge of the sensor panel is wider on a side of the sensor panel that is connected to the wiring member, and therefore it is difficult to sufficiently reduce the size of the radiation detection apparatus. In view of this, one aspect of the present invention provides technology for achieving a reduction in the size of a radiation detection apparatus while improving the humidity resistance of the radiation detection apparatus.

One aspect of the present invention provides a radiation detection apparatus comprising: a sensor panel including a photoelectric conversion region and an electrically conductive pattern that is electrically connected to the photoelectric conversion region; a scintillator layer disposed over the photoelectric conversion region of the sensor panel; a wiring member including a portion overlapping with the electrically conductive pattern and electrically connected to the electrically conductive pattern and; and a protective film covering the scintillator layer and the portion of the wiring member that overlaps with the electrically conductive pattern, wherein a region of the protective film that covers the wiring member includes a portion that is press-bonded to the sensor panel.

Further features of the present invention will become apparent from the following description of exemplary embodiments with reference to the attached drawings.

BRIEF DESCRIPTION OF THE DRAWINGS

The accompanying drawings, which are incorporated in and constitute a part of the specification, illustrate embodiments of the invention, and together with the description, serve to explain the principles of the invention.

DESCRIPTION OF THE EMBODIMENTS

Hereinafter, embodiments of the present invention will be described with reference to the accompanying drawings.

First Embodiment

Figure 1A:
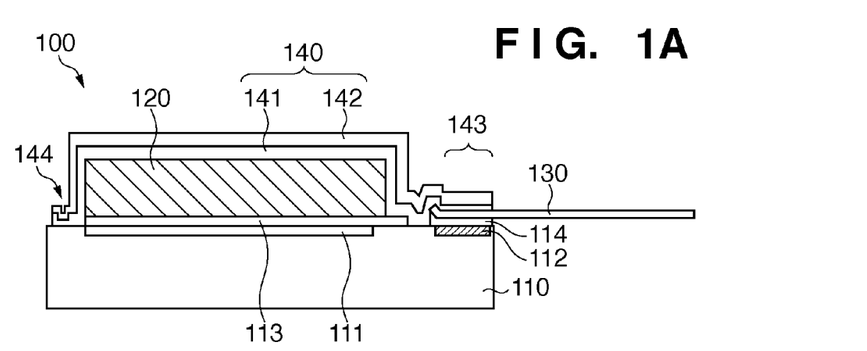
FIGS. 1A to 1C are diagrams illustrating an exemplary structure of a radiation detection apparatus 100 according to a first embodiment.
Figure 1B:
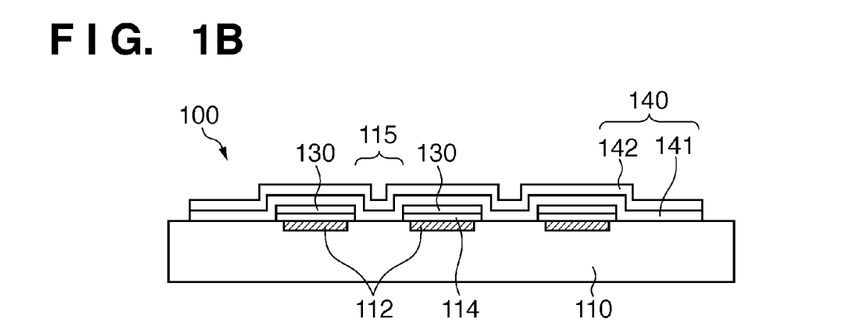
Figure 1C:
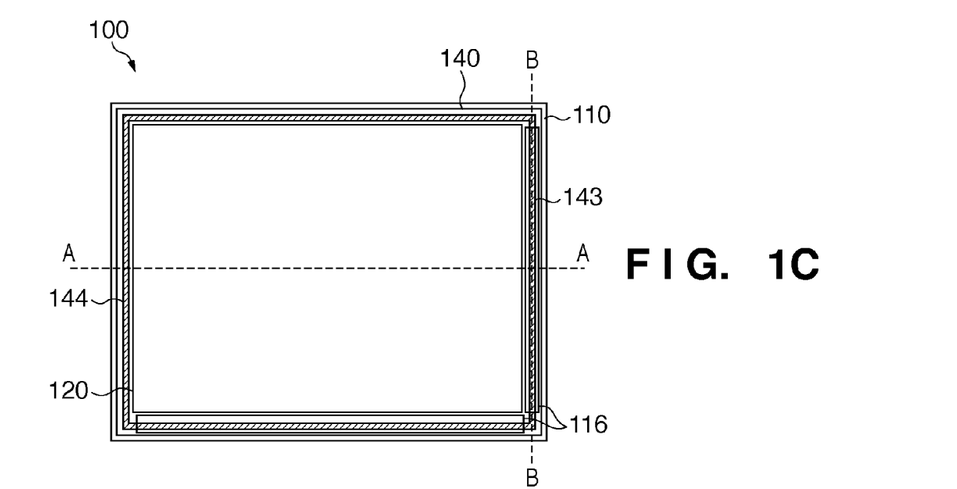

An exemplary radiation detection apparatus 100 according to the present embodiment will be described with reference to FIGS. 1A to 1C and FIGS. 2A to 2C. FIG. 1C is a schematic plan view of the radiation detection apparatus 100, FIG. 1A is a schematic cross-sectional view of the radiation detection apparatus 100 taken along line A-A in FIG. 1C, and FIG. 1B is a schematic cross-sectional view of the radiation detection apparatus 100 taken along line B-B in FIG. 1C. Although the periphery of a scintillator layer 120 is shown by the solid line in FIG. 1C for ease of understanding, in actuality the scintillator layer 120 is covered with a protective film 140. Also in FIG. 1C, a wiring member 130 is not shown in order to facilitate viewing. The radiation detection apparatus 100 comprises a sensor panel 110, the scintillator layer 120, the wiring member 130, and the protective film 140.

The sensor panel 110 has a photoelectric conversion region 111 and an electrically conductive pattern 112. The photoelectric conversion region 111 is where photoelectric conversion elements for covering light converted from radiation by the scintillator layer 120 into electric charge are formed. The photoelectric conversion elements are electrically connected to the electrically conductive pattern 112, and a signal from the photoelectric conversion region 111 is read out through the electrically conductive pattern 112 to a circuit outside the radiation detection apparatus 100. As shown in FIG. 1C, the radiation detection apparatus 100 according to the present embodiment includes a region 116 in which the electrically conductive pattern 112 is formed on two adjacent sides of the sensor panel 110, and the electrically conductive pattern 112 is not formed on the other sides of the sensor panel 110. On the photoelectric conversion region 111 is disposed a sensor protective layer 113 for protecting the photoelectric conversion region 111. The sensor protective layer 113 is formed of, for example, silicon oxide or silicon nitride.

Over the sensor protective layer 113 is formed the scintillator layer 120 so as to cover the photoelectric conversion region 111. The scintillator layer 120 is formed of, for example, a material consisting primarily of alkali halides, such as CsI(Tl), CsI(Na), or CsBr(Tl). For instance, CsI(Tl) is produced by simultaneous vapor deposition of CsI and TlI.

The electrically conductive pattern 112 is electrically connected to the wiring member 130 via an adhesion layer 114. As shown in FIG. 1A, the wiring member 130 overlaps with the electrically conductive pattern 112. The wiring member 130 may, for example, be a wiring film, and the adhesion layer 114 may, for example, be an anisotropic electrically conductive film with thermal fluidity. In the case of using an anisotropic electrically conductive film, the electrically conductive pattern 112 and the wiring member 130 are electrically connected to each other by thermocompression of the anisotropic electrically conductive film at approximately 200° C. As shown in FIG. 1B, the electrically conductive pattern 112 is separated into multiple parts, and each part of the electrically conductive pattern 112 is connected to a separate wiring member 130 and spaced from the other parts at intervals equal to those between each of the wiring members 130. In the example shown in FIG. 1B, the adhesion layer 114 is also separated into multiple parts, each corresponding to a pair of each part of the electrically conductive pattern 112 and a wiring member 130.

The upper and side faces of the scintillator layer 120 are covered with the protective film 140 that includes a hot-melt resin 141 and metal foil 142. The hot-melt resin 141 will be described in detail later. Among light converted and emitted from the scintillator layer 120, the light traveling in the opposite direction to the photoelectric conversion region 111 is reflected by the metal foil 142 toward the photoelectric conversion region 111, which improves light use efficiency. The metal foil 142 can also cut off the path of light from the outside of the radiation detection apparatus 100, thus preventing entry of noise from the photoelectric conversion region 111. The metal foil 142 may, for example, be aluminum foil having a thickness of 1 to 100 μm. The protective film 140 covers portions of the wiring members 130 that overlap with the electrically conductive pattern 112 on the sides of the sensor panel 110 on which the electrically conductive pattern 112 has been formed (the right side in FIG. 1A). The protective film 140 further covers a region 115 between each adjacent pair of the wiring members 130 as shown in FIG. 1B. Meanwhile, the protective film 140 covers the surface of the sensor panel 110 around the scintillator layer 120 on the sides of the sensor panel 110 other than the sides on which the electrically conductive pattern 112 has been formed (the left side in FIG. 1A).

The protective film 140 includes hot-pressed portions 143 and 144. The "hot-pressed portions" as used herein refer to regions in which part of the hot-melt resin 141 is press-bonded by heat-pressing so as to have a smaller thickness than the other parts. On the sides of the sensor panel 110 on which the electrically conductive pattern 112 has been formed, the hot-pressed portion 143 is formed in a region in which the protective film 140 covers the wiring members 130. The hot-pressed portion 143 is also formed in a portion of the protective film 140 that covers the region 115. In this case, on the sides of the sensor panel 110 on which the electrically conductive pattern 112 has been formed, the hot-pressed portion 143 is continuously formed overlapping with the region 116 in which the electrically conductive pattern 112 has been formed, as shown in FIG. 1C. Meanwhile, on the sides of the sensor panel 110 other than the sides on which the electrically conductive pattern 112 has been formed, the hot-pressed portion 144 is formed in a region in which the protective film 140 covers the surface of the sensor panel 110. As a result, the hot-pressed portions 143 and 144 completely encircle the scintillator layer 120 as shown in FIG. 1C. This improves the humidity resistance of the radiation detection apparatus 100. Furthermore, since the hot-pressed portion 143 is formed overlapping with the wiring members 130, the distance between the edge of the scintillator layer 120 and the edge of the sensor panel 110 can be reduced on the sides on which the electrically conductive pattern 112 has been formed, which enables a reduction in the size of the radiation detection apparatus 100. In the present embodiment, since the hot-pressed portion 143 and the wiring members 130 overlap each other, it is possible to secure the width of the hot-pressed portion 143 while achieving a reduction in size. As a result, the humidity resistance of the radiation detection apparatus 100 can be maintained. Furthermore, because the region in which the electrically conductive pattern 112 and the wiring members 130 overlap each other is secured, it is possible to reduce the possibility of a decrease in electrical resistance at such connecting portions and resultant influence on the sensor performance.

Next is a description of a hot-melt resin. The hot-melt resin is defined as an adhesive resin formed of a 100-percent nonvolatile thermoplastic material that does not contain any water and solvents and is solid at room temperature (Thomas. P. Flanagan, Adhesive Age, 9, No. 3, 28 (1996)). The hot-melt resin melts with increasing resin temperature and solidifies with decreasing resin temperature. The hot-melt resin has a property of adhering to an organic or inorganic material in a state of being heated and melted, and has a property of not providing adhesion in a solid state at ordinary temperatures. Furthermore, the hot-melt resin does not contain any polar solvents, solvents, and water. Thus, even if the hot-melt resin is in contact with the scintillator layer 120 that is deliquescent (for example, a scintillator having a columnar crystal structure of an alkali halide), it does not dissolve the scintillator layer 120 and thus can be used as the protective film 140. The hot-melt resin differs from a solvent volatilization curing adhesive resin that is produced by dissolving a thermoplastic resin in a solvent and applying a solvent application method. The hot-melt resin also differs from a chemical reaction adhesive resin, typified by an epoxy resin that is produced by chemical reactions.

Hot-melt resin materials are classified by the type of a base polymer (base material), which is a principal constituent, and for example, polyolefin, polyester, or polyamide resin materials may be used. In order to use such a resin material as the protective film 140 as mentioned above, it is important for the material to have high humidity resistance and high light transmittance in order to transmit visible light produced by the scintillator layer 120. Examples of the hot-melt resins that satisfy the required humidity resistance as the protective film 140 include polyolefin resins and polyester resins. In particular, low moisture-absorbent polyolefin resins may be used. Polyolefin resins are also highly light transmissive. Accordingly, a hot-melt resin based on a polyolefin resin may be used as the protective film 140.

The adhesion of the hot-melt resin 141, which contains a hot-melt resin, to the scintillator layer 120, the sensor protective layer 113, and the wiring members 130 depends on the coefficient of melt viscosity of the resin and the tensile strength of the resin. The viscosity coefficient required in terms of adhesion properties may be $1\times10^4$ Pa·s or less. In particular, it may be $6.0 \times 10^3$ Pa·s or less. If the coefficient of melt viscosity exceeds $1 \times 10^4$ Pa·s, it is difficult to obtain the required adhesion to the scintillator layer 120, the sensor protective layer 113, and the wiring members 130. Accordingly, the viscosity coefficient of the hot-melt resin used for the radiation detection apparatus 100 may be in the range of $1 \times 10^3$ to $1 \times 10^4$ Pa·s at temperatures of 100 to 140° C. In particular, it may be in the range of $1.5 \times 10^3$ to $6.0 \times 10^3$ Pa·s.

The tensile strength required in terms of adhesion properties is in the range of 40 to 300 Kg/cm², and in particular, in the range of 50 to 200 Kg/cm². If the tensile strength is less than 40 Kg/cm², enough strength required as the protective film 140 may not be obtained. If the tensile strength exceeds 300 Kg/cm², delamination between the hot-melt resin 141 and the scintillator layer 120, which can possibly be caused by the difference in thermal expansion coefficient between the sensor panel 110 and the hot-melt resin 141, may not be prevented. Such delamination depends on not only the tensile strength but also the elongation percentage at break. The elongation percentage at break of the hot-melt resin that can be used in the radiation detection apparatus 100 may be 400% or more, and in particular, in the range of 600 to 1000%.

The adhesion and the melting start temperature required for the hot-melt resin used in the radiation detection apparatus 100, the adhesion being in terms of the coefficient of melt viscosity, the tensile strength, and the elongation percentage at break, can be controlled by changing the following elements individually or in a combination of two or more:

(1) Copolymer content in the hot-melt resin;

(2) Acrylic acid content, acrylic acid ester content, methacrylic acid content, and methacrylic acid ester content in the copolymer(s) contained in the hot-melt resin; and

(3) Additive content in the hot-melt resin.

Below is a description of copolymer/copolymers contained in the hot-melt resin and various substances constituting the copolymer(s).

In the present embodiment, a hot-melt polyolefin resin that can be used as the protective film 140 may contain, as a main component, at least one copolymer selected from the group consisting of (A) to (E): (A) ethylene-vinyl acetate copolymers, (B) ethylene-acrylic acid copolymers, (C) ethylene-acrylic acid ester copolymers, (D) ethylene-methacrylic acid copolymers, and (E) ethylene-methacrylic acid ester copolymers and ionomer resins.

The following is a description of the aforementioned five types of copolymers A to E.

(A) Ethylene-vinyl acetate copolymers are copolymers of substances having a molecular structure of an ethylene unit ($—CH_2—CH_2—$) and vinyl acetate ($—CH_2—CH(OCOCH_3)—$). A general formula for the ethylene-vinyl acetate copolymers is:

where a, b, and n are integers. The vinyl acetate content in ethylene may be in the range of 2 to 40% by weight. The vinyl acetate content may be reduced in order to improve the humidity resistance of the hot-melt resin. Alternately, the vinyl acetate content may be increased in order to increase the strength of bonding to the scintillator layer 120. The hot-melt resin used in the radiation detection apparatus 100 may have an ethylene-vinyl acetate copolymer content of 5 to 20%.

(B) Ethylene-acrylic acid copolymers (EAA) are copolymers of substances having a molecular structure of an ethylene unit ($—CH_2—CH_2—$) and acrylic acid ($—CH_2—CHCOOH—$), the acrylic acid having a structure in which a carboxyl group is randomly contained in a polyethylene structure. A general formula for the ethylene-acrylic acid copolymers is:

where a, b, and n are integers. The acrylic acid content in ethylene may be in the range of 4 to 20% by weight. Like vinyl acetate described above, the acrylic acid content may be reduced in order to improve the humidity resistance of the hot-melt resin. Alternately, the acrylic acid content may be increased in order to improve the adhesion to the scintillator layer 120. The hot-melt resin used in the radiation detection apparatus 100 may have an ethylene-acrylic acid copolymer content of 5 to 20%.

(C) Ethylene-acrylic acid ester copolymers are copolymers of substances having a molecular structure of an ethylene unit ($—CH_2—CH_2—$) and an acrylic ester ($—CH_2—CHCOOR—$). A general formula for the ethylene-acrylic acid ester copolymers is:

where a, b, and n are integers (here, R is one of $CH_3$, $C_2H_5$, and $C_3H_7$). The acrylic ester content in ethylene may be in the range of 2 to 35% by weight. As above, the acrylic ester content may be reduced in order to increase the humidity resistance of the hot-melt resin. Alternatively, the acrylic ester content may be increased in order to improve the adhesion to the scintillator layer 120. The hot-melt resin used in the radiation detection apparatus 100 may have an ethylene acrylic ester copolymer content of 8 to 25%.

(D) Ethylene-methacrylic acid copolymers are copolymers of substances having a molecular structure of an ethylene unit ($—CH_2—CH_2—$) and methacrylic acid ($—CH_2—CCH_3COOH—$), the methacrylic acids having a structure in which a carboxyl group(s) is randomly contained in a polyethylene structure. A general formula for the ethylene-methacrylic acid copolymers is:

where a, b, and n are integers. The methacrylic acid content in ethylene may be in the range of 2 to 20% by weight. As above, the methacrylic acid content may be reduced in order to increase the humidity resistance of the hot-melt resin. Alternatively, the methacrylic acid content may be increased in order to improve the adhesion to the scintillator layer 120. The hot-melt resin used in the radiation detection apparatus 100 may have an ethylene-methacrylic acid copolymer content of 5 to 15%.

(E) Ethylene-methacrylic acid ester copolymers are copolymers of substances having a molecular structure of an ethylene unit ($—CH_2—CH_2—$) and a methacrylic acid ester ($—CH_2—CCH_3COOR—$). A general formula for the ethylene-methacrylic acid ester copolymers is:

where a, b, and n are integers. The methacrylic acid ester content in ethylene may be in the range of 2 to 25% by weight. As above, the methacrylic acid ester content may be reduced in order to increase the humidity resistance of the hot-melt resin. Alternatively, the methacrylic acid ester content may be increased in order to improve the adhesion to the scintillator layer 120. The hot-melt resin used in the radiation detection apparatus 100 may have an ethylene-methacrylic acid ester copolymer content of 3 to 15%.

The hot-melt resin used in the radiation detection apparatus 100 contains at least one type of the above-described five types of copolymers, or may contain a mixture of two or more types of the above-described types of copolymers. Also, the hot-melt resin used in the radiation detection apparatus 100 may contain a mixture of two or more different copolymers of the same type of copolymers, for example, a mixture of an ethylene-methyl methacrylate copolymer and an ethylene-ethyl methacrylate copolymer. In the resin used in the radiation detection apparatus 100, the mean molecular weight of the copolymer(s) contained in the hot-melt resin may be in the range of about 5,000 to 1,000,000.

Examples of an additive added to the hot-melt resin include tackifiers and softeners. Examples of the tackifiers include natural resins, such as rosin, polymerized rosin, hydrogenated rosin, and rosin esters, modifiers of the natural resins, aliphatic compounds, alicyclic compounds, aromatic series, petroleum resins, terpene resins, terpene phenol resins, hydrogenated terpene resins, and coumarone resins. Examples of the softeners include processing oils, paraffin oils, castor oils, polybutene, and low molecular weight polyisoprene.

The hot-melt resin used as the protective film 140 in the radiation detection apparatus 100 (in particular, a radiation detection apparatus for use in photography of human or animals) may be a hot-melt resin having a humidity-resistant protective function that is not affected by splashing of rubbing alcohol. Examples of hot-melt resins that are completely or partially insoluble in ethyl alcohol, which is rubbing alcohol, include hot melt resins in which the additive content, such as a tackifier, is 20% or less. In particular, the additive content may be 10% or less. Ethanol is a solvent used in environments using radiation detection apparatuses, such as hospitals, and there are cases where ethanol is deposited on the radiation detection apparatuses. The inventors have found that, if the degree of solubility of the hot-melt resin in the solvent is 20% or less, delamination will not occur due to the dissolution of the protective film 140. In order to improve the adhesion of the hot-melt resin 141, which contains a hot-melt resin, to the scintillator layer 120 having a columnar crystal structure, the surface of the hot-melt resin 141 that abuts on the scintillator layer may be reformed in advance. For example, the critical surface tension of the surface of the hot-melt resin 141 may be set equal to or greater than $40 \times 10^{-3}$ J/m$^2$, and, in particular, equal to or greater than $45 \times 10^{-3}$ J/m$^2$ in order to improve the adhesion. In the case where the acrylic acid content, the acrylic ester content, the methacrylic acid content, or the methacrylate ester content, for example, in the copolymer(s) in the composition of the hot-melt resin is 20 wt % or less, the critical surface tension of the protective film 140 containing a hot-melt resin is in the range of $30 \times 10^{-3}$ J/m$^2$ to $37 \times 10^{-3}$ J/m$^2$. This results in increased leakage into the surface of the scintillator layer 120 and the surface of the sensor panel 110 around the scintillator layer 120. In this case, although the adhesion of the protective film 140 to the scintillator layer 120, the sensor panel 110, and the wiring members 130 tends to decrease somewhat, this adhesion can be improved by reforming the aforementioned surface of the hot-melt resin 141 and thereby improving the critical surface tension of the hot-melt resin. There are no particular limitations on the method for reforming the above surface, and for example, a method such as corona discharge treatment, ozone treatment, alkali treatment, argon plasma treatment, or oxygen plasma treatment may be used appropriately. Performing corona discharge treatment on both of the surfaces of the hot-melt resin 141 containing a hot-melt resin, using a corona discharge device, improves the critical surface tension of the surface of the protective film 140. Note that in the present embodiment, measurement of the critical surface tension is performed in accordance with the JIS K-6768 method. The adhesion required between the protective film 140 and the sensor panel 110 in the present embodiment may be 0.1 kg/25 mm or more in the 90° peel adhesion test.

Figure 2A:
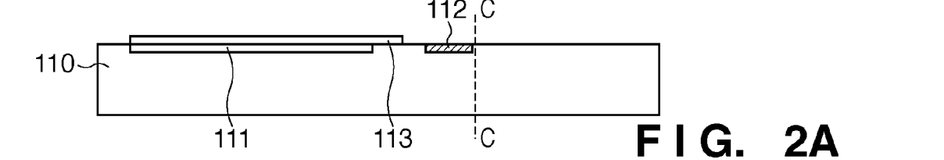
FIGS. 2A to 2F are diagrams illustrating an exemplary manufacturing method for the radiation detection apparatus 100 according to the first embodiment.
Figure 2B:
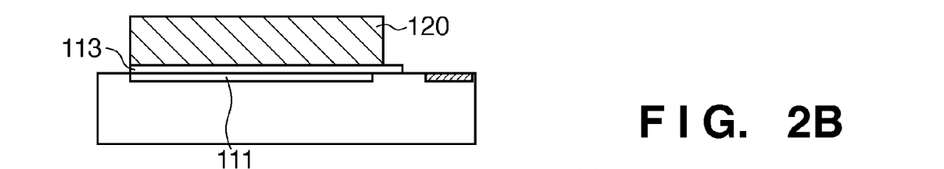
Figure 2C:
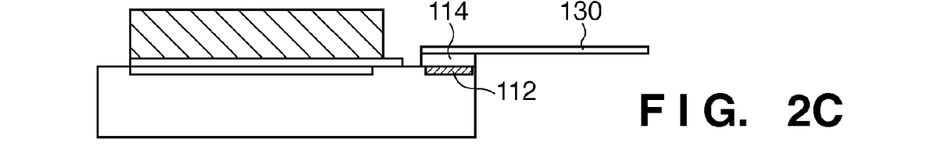

Next is a description of an exemplary manufacturing method for the radiation detection apparatus 100 with reference to FIGS. 2A to 2F and FIG. 3. As shown in FIG. 2A, a sensor panel 110 having the photoelectric conversion region 111 and the electrically conductive pattern 112 is prepared. The sensor protective layer 113 is formed on the photoelectric conversion region 111 of the sensor panel 110, and the sensor panel 110 is cut along line C-C by a scriber. Next, the scintillator layer 120 is formed by vapor deposition of CsI(Tl) on the sensor protective layer 113 so as to cover the photoelectric conversion region 111 as shown in FIG. 2B. Then, the electrically conductive pattern 112 is cleaned and the adhesion layer 114 is temporarily stuck on the electrically conductive pattern 112 as shown in FIG. 2C. Thereafter, the wiring members 130 are aligned and temporarily press-bonded to the adhesion layer 114.

Figure 2D:
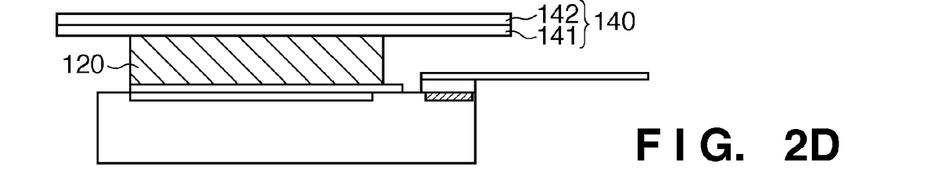
Figure 2E:
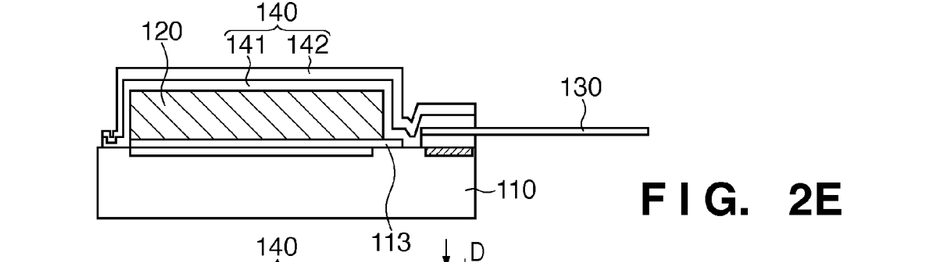

Then, the protective film 140, which includes the hot-melt resin 141 and the metal foil 142, is aligned and temporarily stuck on the scintillator layer 120 as shown in FIG. 2D. Then, as shown in FIG. 2E, the protective film 140 is subjected to vacuum thermocompression so that the hot-melt resin 141 is bonded to the side faces of the scintillator layer 120, the sensor protective layer 113, the surface of the sensor panel 110, and part of the wiring members 130. The surfaces of the wiring members 130, the sensor panel 110, and the sensor protective layer 113, for example, that contact the hot-melt resin 141 may be reformed in advance with atmospheric pressure plasma or the like, prior to bonding to the hot-melt resin 141. This improves the adhesion of the hot-melt resin 141 to those surfaces. If the fluidity of the hot-melt resin 141 is increased too high by the vacuum thermocompression, the hot-melt resin 141 will enter the gaps between each column of the scintillator layer 120, thereby reducing the resolution of the radiation detection apparatus 100. Therefore, the temperature and pressure for the vacuum thermocompression are controlled in order to prevent the hot-melt resin 141 from entering the gaps between each column of the scintillator layer 120 while maintaining the adhesion of the hot-melt resin 141 to the side faces of the scintillator layer 120 and so on. Accordingly, merely performing vacuum thermocompression is not sufficient in order to ensure the bonding strength that is enough to prevent the entry of outside moisture through the gaps between the hot-melt resin 141 and the wiring members 130.

Figure 2F:
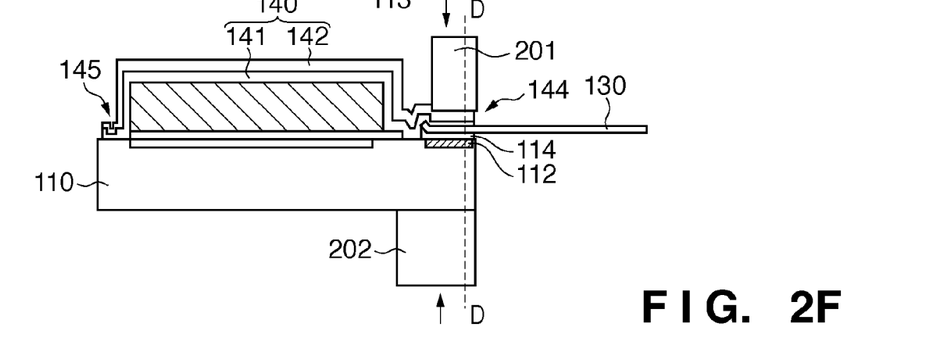

Next, hot pressing (heat pressing) is performed with the sensor panel 110, the adhesion layer 114, the wiring members 130, and the protective film 140 sandwiched between a thermocompression head 201 and a supporting unit 202 as shown in FIG. 2F. Through the hot-pressing, the hot-melt resin 141 flows and is press-bonded to the wiring members 130, and also the adhesion layer 114 flows and provides bonding between the electrically conductive pattern 112 and the wiring members 130. In the case where the adhesion layer 114 is an anisotropic electrically conductive film, the electrically conductive pattern 112 and the wiring member 130 are electrically connected to each other through this hot-pressing. In this way, by hot pressing the portion of the protective film 140 that covers the wiring member 130 to the sensor panel 110, the bonding between the electrically conductive pattern 112 and the wiring members 130 can also be accomplished simultaneously. The hot-pressed portion 144 is similarly formed.

Figure 3:
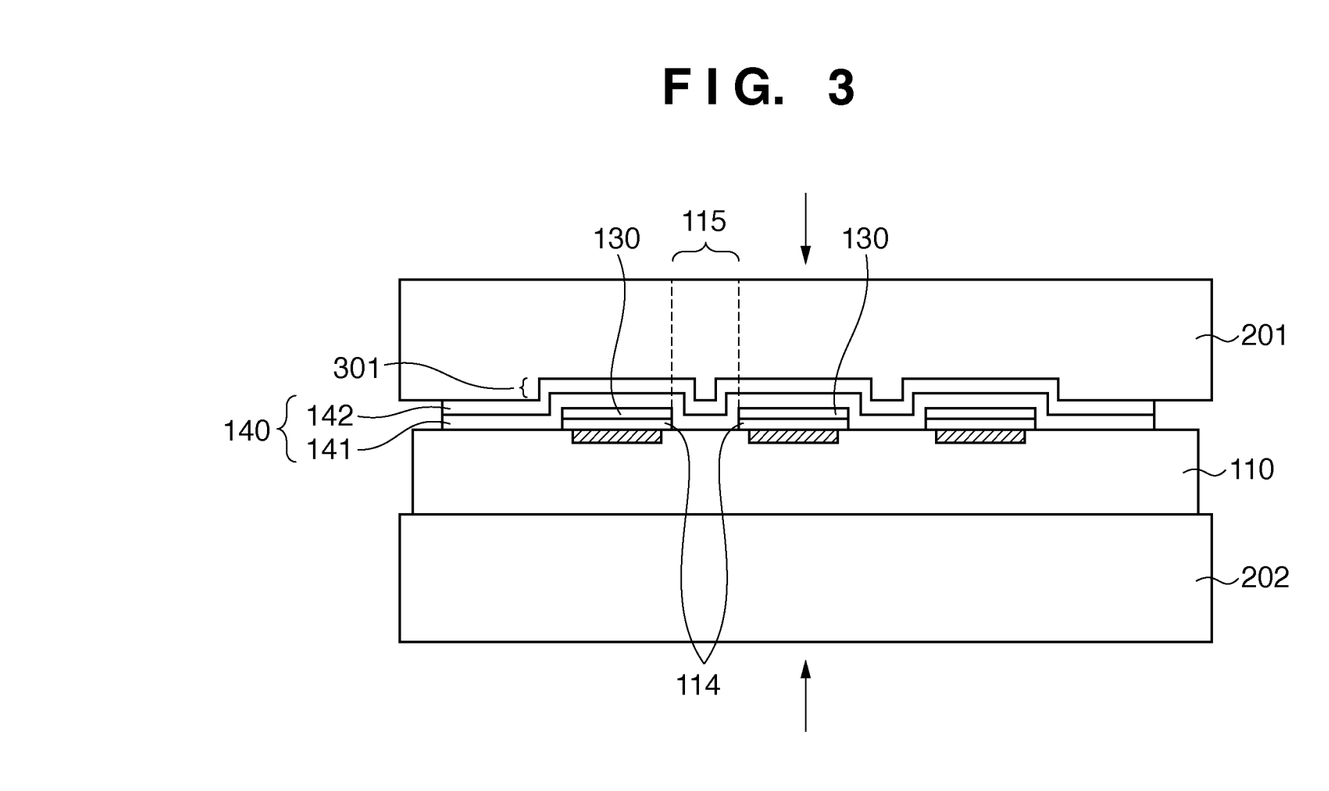
FIG. 3 is a diagram illustrating exemplary hot-pressing according to the first embodiment.

FIG. 3 is a schematic cross-sectional view taken along line D-D in FIG. 2F. The thermocompression head 201 has steps 301 formed in accordance with the shapes of the adhesion layer 114 and the wiring members 130 formed on the sensor panel 110. The inclusion of the steps 301 in the thermocompression head 201 enables even the portion of the protective film 140 that covers the region 115 to be hot-pressed uniformly. This further improves the humidity resistance of the radiation detection apparatus 100. The steps 301 of the thermocompression head 201 may be designed taking into consideration the thicknesses of the hot-melt resin 141 and the adhesion layer 114 after their flow.

Consider the case where, in the hot-pressing, the flow starting temperature (melting point) of the hot-melt resin 141 is much lower than that of the adhesion layer 114. In this case, if hot pressing is performed in a condition that the temperature of the thermocompression head 201 is set equal to or higher than the flow starting temperature of the adhesion layer 114, there is the possibility of the hot-melt resin 141 flowing excessively and flowing off the wiring members 130, thereby reducing the humidity resistance. On the contrary, if the flow starting temperature of the hot-melt resin 141 is much higher than that of the adhesion layer 114, there is the possibility of the adhesion layer 114 delaminating and causing misalignment between the electrically conductive pattern 112 and the wiring member 130. Accordingly, the flow starting temperature of the hot-melt resin 141 can be set close to that of the adhesion layer 114.

Figure 4A:
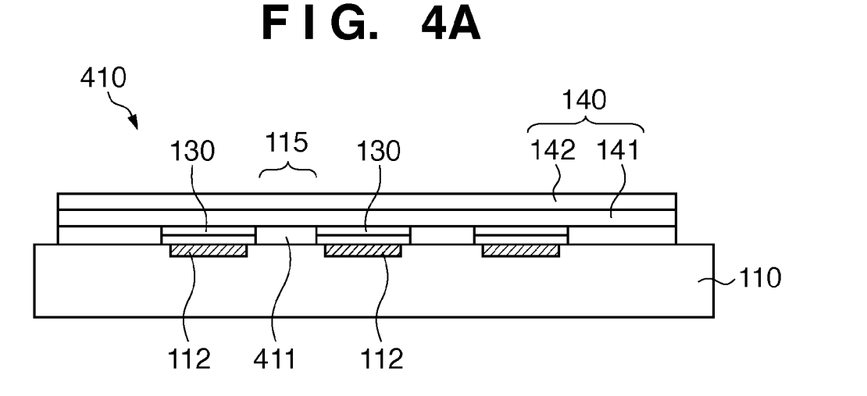
FIGS. 4A to 4C are diagrams illustrating modifications of the radiation detection apparatus according to the first embodiment.
Figure 4B:
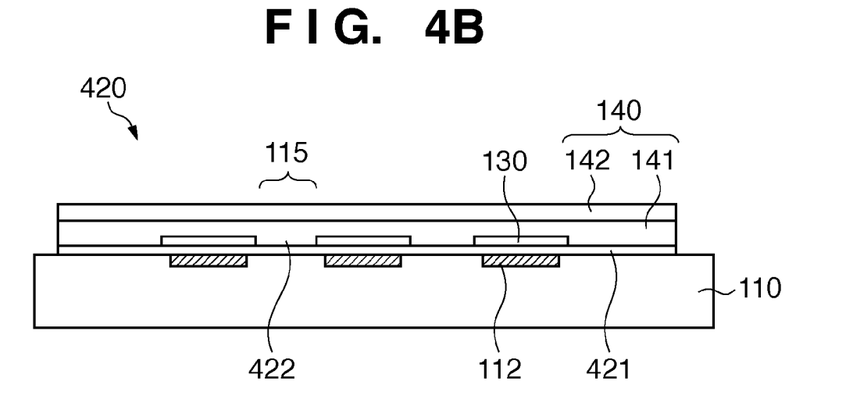
Figure 4C:
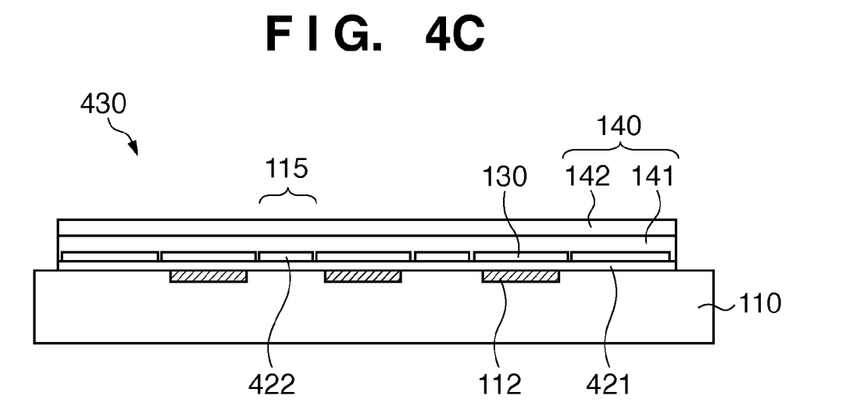

The following is a description of modifications of the present embodiment with reference to FIGS. 4A to 4C. The following descriptions of the modifications focuses on differences from the above-described radiation detection apparatus 100, and redundant description will be omitted. FIGS. 4A to 4C are schematic cross-sectional views of radiation detection apparatuses when viewed in the same direction as in FIG. 1B.

In a radiation detection apparatus 410 shown in FIG. 4A, a step reducing layer 411 is formed in a region 115 between each adjacent pair of the wiring members 130 in order to reduce a step between a region where the wiring member 130 has been formed and the region 115. The step reducing layer 411 is formed such that the height from the surface of the sensor panel 110 to the upper surface of the step reducing layer 411 is equal to the height from the surface of the sensor panel 110 to the upper surface of the wiring member 130. The presence of the step reducing layer 411 reduces a step between the portion of the protective film 140 that covers the wiring members 130 and the portion of the protective film 140 that covers the region 115 (that is, a portion that covers the step reducing layer 411). By forming the step reducing layer 411 in this way, hot pressing can be performed uniformly without the need to provide the thermocompression head with steps. The step reducing layer 411 may be formed by, for example, casting a silicon or epoxy resin to the region 115 and then curing the resin, or may be formed by thermocompression of a hot-melt resin. Furthermore, the step reducing layer 411 may be formed of a film material such as polyimide, PET, or polycarbonate.

In a radiation detection apparatus 420 shown in FIG. 4B, a continuous adhesion layer 421 is formed, instead of separate adhesion layers formed for each pair of the electrically conductive pattern 112 and a wiring member 130. This reduces a step between the region in which the wiring member 130 has been formed and a region 115. In a radiation detection apparatus 430 shown in FIG. 4C, a continuous adhesion layer 421 is formed, and in addition, a step reducing layer 422 is formed in a region 115. The step reducing layer 422 is the same as the step reducing layer 411 described with reference to FIG. 4A, and therefore a description thereof has been omitted.

Second Embodiment

Figure 5A:
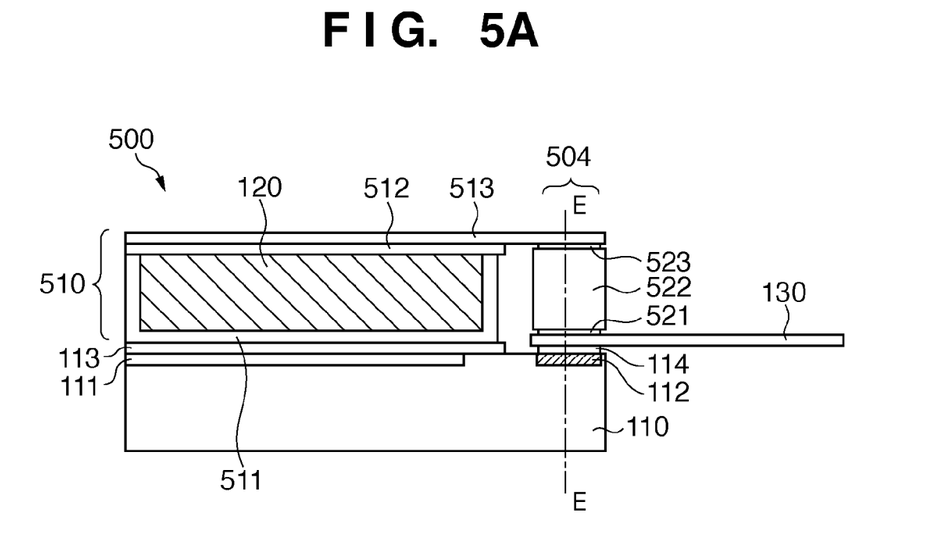
FIGS. 5A and 5B are diagrams illustrating an exemplary configuration of a radiation detection apparatus 500 according to a second embodiment.
Figure 5B:
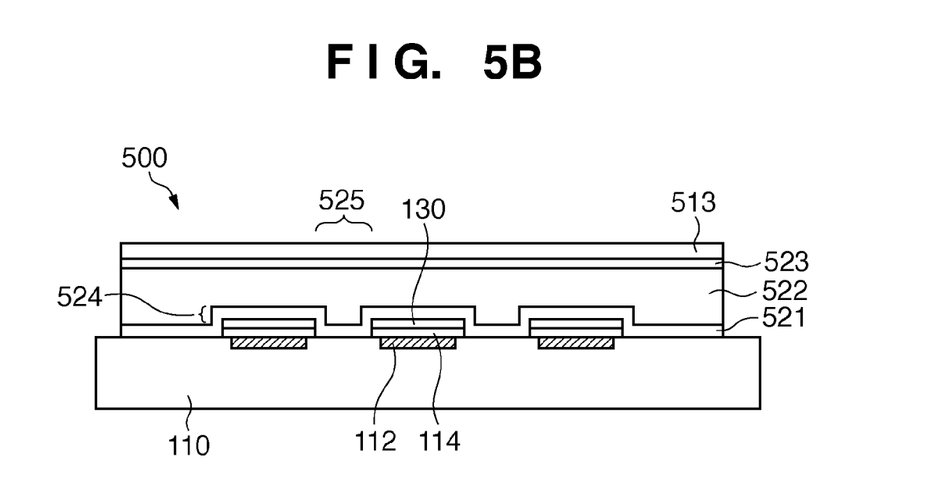

In the present embodiment, a description is given of a radiation detection apparatus that is manufactured by separately producing a sensor panel 110 and a scintillator panel 510 including a scintillator layer 120, and then bonding both of the panel and the plate. Such a manufacturing method for a radiation detection apparatus is hereinafter referred to as an "indirect method". FIG. 5A is a schematic cross-sectional view of an exemplary radiation detection apparatus 500 manufactured using the indirect method, and FIG. 5B is a schematic cross-sectional view taken along line E-E in FIG. 5A. Note that the same reference numerals have been given to constituent elements that are the same as those described in the first embodiment, and description thereof has been omitted. Furthermore, the modifications described in the first embodiment are also applicable to the present embodiment.

In the radiation detection apparatus 500, the scintillator panel 510 includes the scintillator layer 120, a protective film 511 consisting primarily of an adhesive material and a base protective layer 512 consisting primarily of aluminum foil, which surround the scintillator layer 120, and a base 513 consisting primarily of aluminum foil. The base 513 has a function of preventing moisture from entering the scintillator layer 120. The scintillator panel 510 is bonded to the sensor protective layer 113 via the protective film 511, which is an adhesive material, so that the scintillator layer 120 covers a photoelectric conversion region 111. The protective film 511 may be a hot-melt resin.

On portions of the wiring members 130 that cover the electrically conductive pattern 112 is formed a step reducing layer 522 via a hot-melt resin 521. The base 513 is connected on the step reducing layer 522 via a hot-melt resin 523. A portion of the base 513 that covers the step reducing layer 522 includes a hot-pressed portion 504. As shown in FIG. 5B, the step reducing layer 522 has steps 524 formed in accordance with the shapes of an adhesion layer 114 and the wiring members 130, which are formed on the sensor panel 110. The inclusion of the steps 524 in the step reducing layer 522 enables portions of the hot-melt resins 521 and 523 that cover regions 525 to be hot-pressed uniformly. This further improves the humidity resistance of the radiation detection apparatus 500. Furthermore, the presence of the step reducing layer 522 reduces a step between a portion of the base 513 that covers the region 525, a portion of the base 513 that covers the wiring members 130, and a portion of the base 513 that covers the scintillator layer 120.

Figures 6A, 6B:
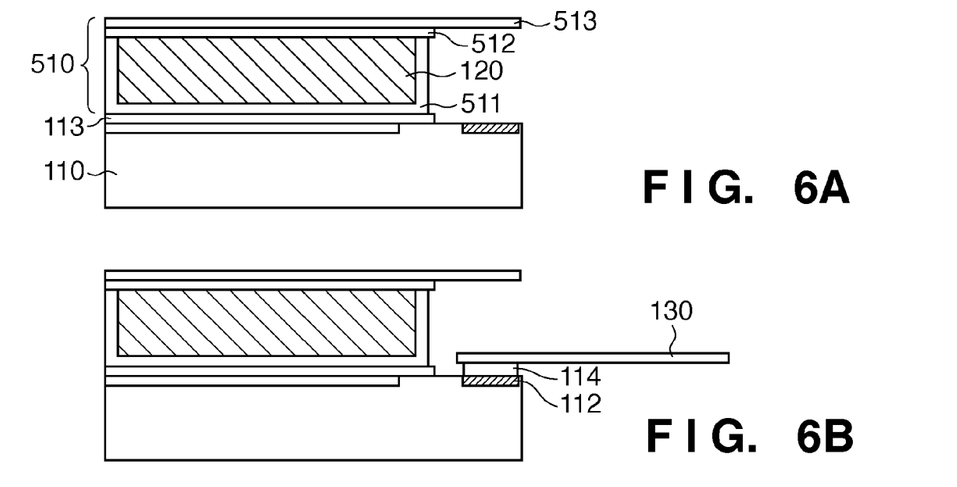
FIGS. 6A to 6D are diagrams illustrating an exemplary manufacturing method for the radiation detection apparatus 500 according to the second embodiment.
Figure 6C:
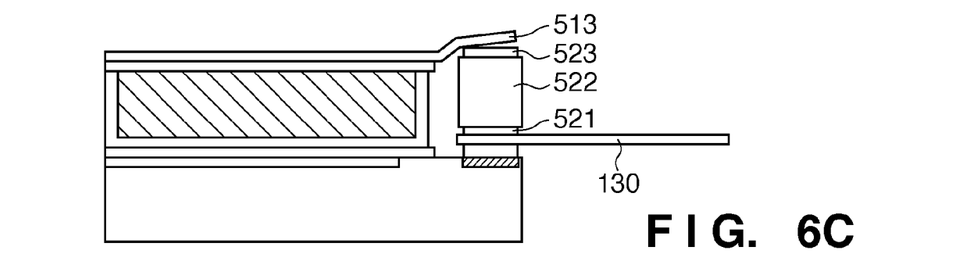
Figure 6D:
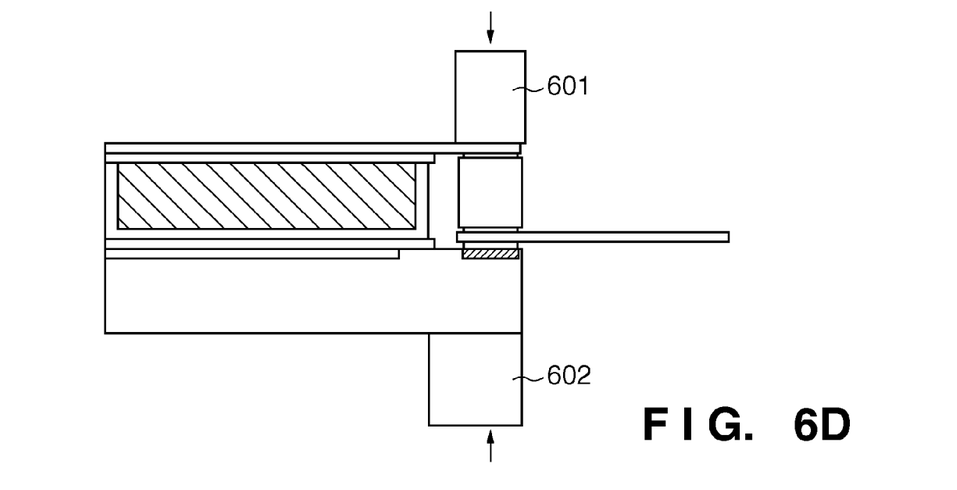

Next is a description of an exemplary manufacturing method for the radiation detection apparatus 500 with reference to FIGS. 6A to 6D. Processing that is the same as that of the first embodiment will not be described. As shown in FIG. 6A, the scintillator panel 510 and the sensor protective layer 113 are bonded to each other. Next, the wiring members 130 are temporarily press-bonded to the electrically conductive pattern 112 via the adhesion layer 114 as shown in FIG. 6B. Then, the step reducing layer 522, on which the hot-melt resins 521 and 523 have temporarily been stuck in advance, is aligned and placed on the wiring members 130 as shown in FIG. 6C. Then, hot pressing is performed with the sensor panel 110, the adhesion layer 114, the wiring member 130, the hot-melt resins 521 and 523, the step reducing layer 522, and the base 513 sandwiched between a thermocompression head 601 and a supporting unit 602, as shown in FIG. 6D.

In the hot-pressing, because a large temperature difference develops between above and below the step reducing layer 522, the flow starting temperature of the hot-melt resin 523 may be set higher than that of the hot-melt resin 521. In addition, a material having excellent thermal conductivity can be used for the step reducing layer 522. For example, examples of the material for the step reducing layer 522 include metal materials such as aluminum and stainless steel, and carbon-based materials.

Figure 7:
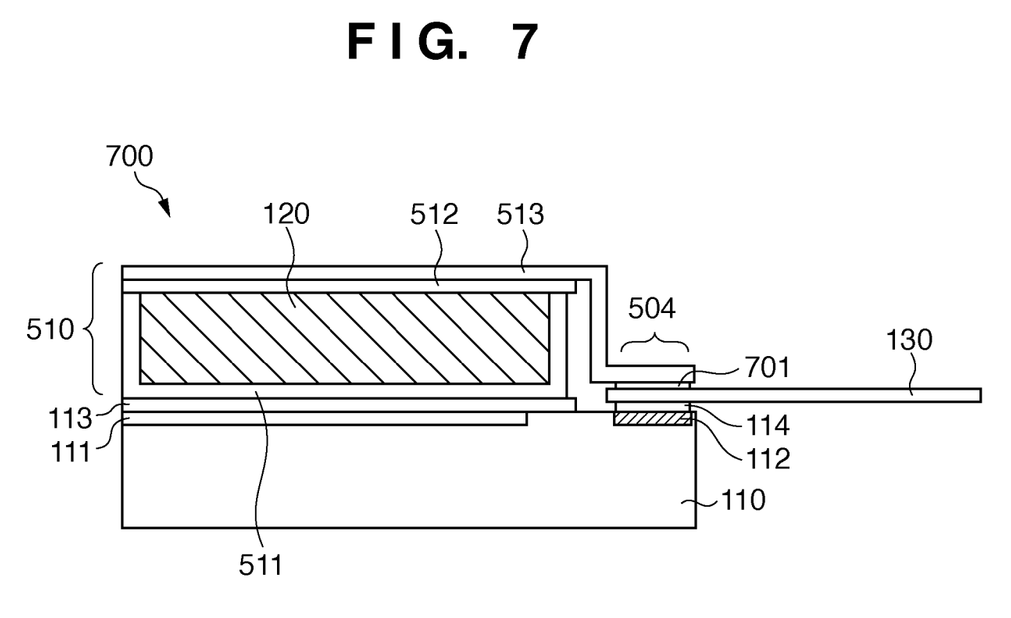
FIG. 7 is a diagram illustrating a modification of the radiation detection apparatus according to the second embodiment.

Next, a modification of the present embodiment is described with reference to FIG. 7. The following description of the modification focuses on differences from the above-described radiation detection apparatus 500, and redundant description will not be given. FIG. 7 is a schematic cross-sectional view of a radiation detection apparatus when viewed in the same direction as in FIG. 5A. In a radiation detection apparatus 700, which does not include a step reducing layer, a wiring member 130 and a base 513 are connected to each other via a hot-melt resin 701, and a hot-pressed portion 504 is formed in the region of connection.

Other Embodiments

Figure 8:
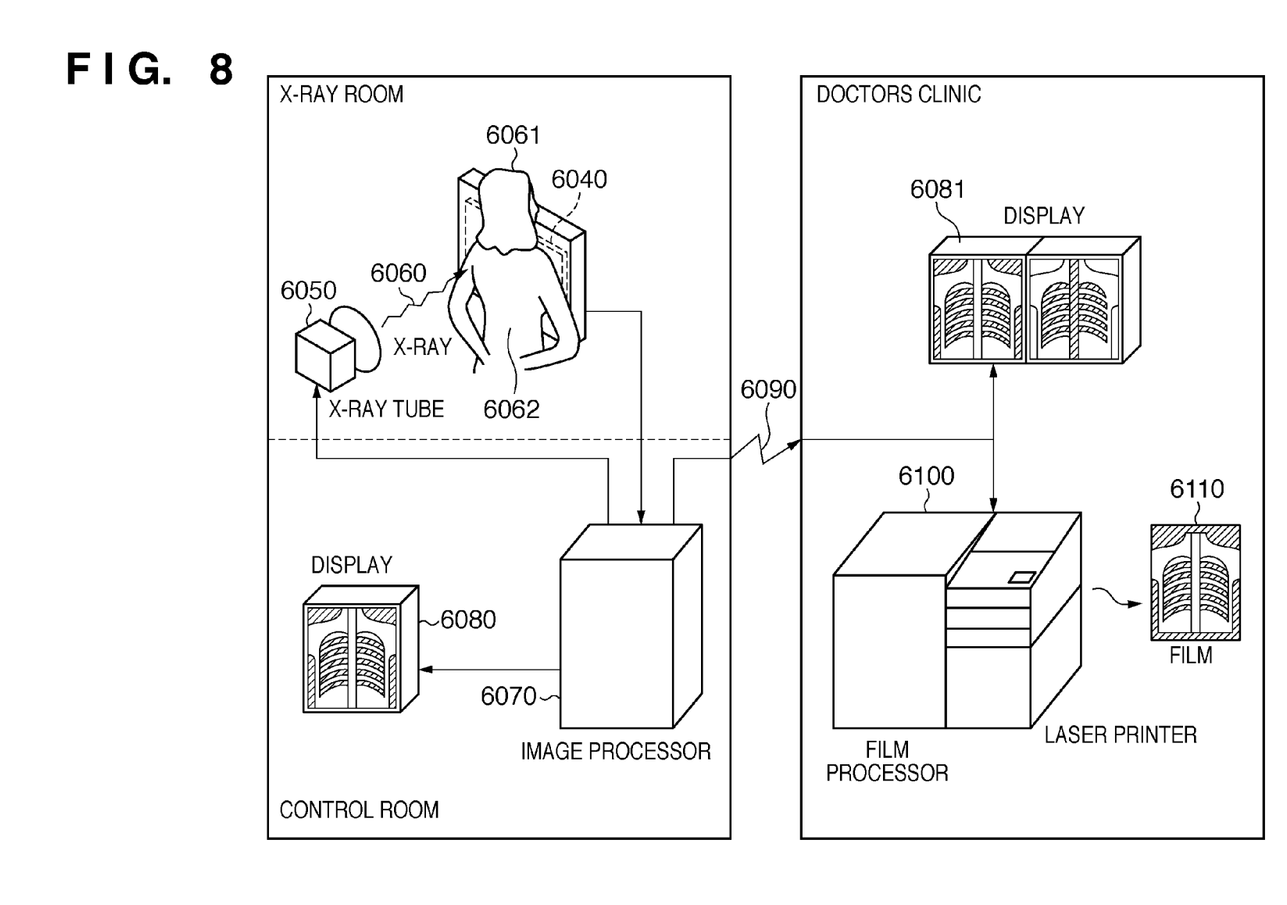
FIG. 8 is a diagram illustrating an exemplary radiation imaging system according to another embodiment.

FIG. 8 is a diagram illustrating an exemplary application of an X-ray imaging apparatus according to the present invention to an X-ray diagnostic system (radiation imaging system). X-rays 6060 produced by an X-ray tube 6050 (radiation source) pass through the chest 6062 of a patient or subject 6061 and enter a photoelectric converter 6040 with a scintillator mounted on the top (a photoelectric converter having a scintillator mounted on the top constitutes a radiation detection apparatus). The incident X-rays carry information about the body of the patient 6061. In response to the incident X-rays, the scintillator emits light, and this light is photoelectrically converted so as to obtain electrical information. The information obtained is converted into a digital signal and subjected to image processing performed by an image processor 6070, which is a signal processing unit, so as to be observable on a display 6080, which is a display unit in a control room. Note that the radiation imaging system includes at least an imaging apparatus and a signal processing unit that processes a signal received from the imaging apparatus.

This information can also be transferred to a remote location using a transmission unit such as a telephone line 6090, and can be displayed on a display 6081, which is a display unit, in a doctors clinic at another place, for example, or can be stored in a recording unit such as an optical disc. Accordingly, a doctor at a remote location can make a diagnosis. The information can also be recorded on a film 6110, which is a recording medium, using a film processor 6100, which is a recording unit.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-138644, filed Jun. 17, 2010, which is hereby incorporated by reference herein in its entirety.

What is claimed is:

1. A radiation detection apparatus comprising:
a sensor panel including a photoelectric conversion region and an electrically conductive pattern that is electrically connected to the photoelectric conversion region;
a scintillator layer disposed over the photoelectric conversion region of the sensor panel;
a wiring member including a portion overlapping with the electrically conductive pattern and electrically connected to the electrically conductive pattern via an adhesion layer; and
a protective film covering the scintillator layer and the portion of the wiring member that overlaps with the electrically conductive pattern, wherein a region of the protective film that covers the wiring member includes a portion that is press-bonded to the sensor panel.

2. The apparatus according to claim 1, wherein the press-bonded portion of the protective film has a smaller thickness than a portion of the protective film that is not press-bonded.

3. The apparatus according to claim 1, comprising: a plurality of the wiring members, wherein the protective film further covers a region between each adjacent pair of the wiring members, and a region of the protective film that covers the region between the wiring members further includes a portion that is press-bonded to the sensor panel.

4. The apparatus according to claim 3, wherein a step reducing layer for reducing a step between a portion of the protective film that covers the region between the wiring members and a portion of the protective film that covers the wiring members is formed between the wiring members.

5. The apparatus according to claim 3, wherein a step reducing layer for reducing a step between a portion of the protective film that covers the region between the wiring members, a portion of the protective film that covers the wiring members, and a portion of the protective film that covers the scintillator layer is formed in both the region between the wiring members and the wiring members.

6. The apparatus according to claim 1, wherein the electrically conductive pattern and the wiring member are adhered to each other with an anisotropic electrically conductive film having thermal fluidity.

7. The apparatus according to claim 1, wherein the protective film is formed of a thermoplastic material, and the press-bonded portion of the protective film is produced by heat-pressing.

8. The apparatus according to claim 7, wherein the protective film is a hot-melt resin.

9. A radiation imaging system comprising: a radiation detection apparatus according to claim 1; and a signal processing unit configured to process a signal received from the radiation detection apparatus.

10. A manufacturing method for a radiation detection apparatus comprising:
preparing a sensor panel including a photoelectric conversion region and an electrically conductive pattern that is electrically connected to the photoelectric conversion region;
forming a scintillator layer over the photoelectric conversion region of the sensor panel;
electrically connecting a wiring member to the electrically conductive pattern, via an adhesion layer, the wiring member including a portion that overlaps with the electrically conductive pattern; and
covering the scintillator layer and the portion of the wiring member that overlaps the electrically conductive pattern with a protective film; and press-bonding a portion of the protective film that covers the wiring member to the sensor panel.

11. A radiation detection apparatus comprising:
a sensor panel including a photoelectric conversion region and an electrically conductive pattern that is electrically connected to the photoelectric conversion region;
a scintillator layer disposed over the photoelectric conversion region of the sensor panel;
a wiring film including a portion overlapping with the electrically conductive pattern and electrically connected to the electrically conductive pattern; and
a protective film covering the scintillator layer and the portion of the wiring film that overlaps with the electrically conductive pattern, wherein a region of the protective film that covers the wiring film includes a portion that is press-bonded to the sensor panel.

12. The apparatus according to claim 11, wherein the wiring film includes a portion that extends over an edge of the sensor panel.

13. A manufacturing method for a radiation detection apparatus comprising:
preparing a sensor panel including a photoelectric conversion region and an electrically conductive pattern that is electrically connected to the photoelectric conversion region;
forming a scintillator layer over the photoelectric conversion region of the sensor panel;
electrically connecting a wiring film to the electrically conductive pattern, the wiring film including a portion that overlaps with the electrically conductive pattern;
covering the scintillator layer and the portion of the wiring film that overlaps the electrically conductive pattern with a protective film; and
press-bonding a portion of the protective film that covers the wiring film to the sensor panel.

* * * * *